(12) United States Patent
Urakawa et al.

(10) Patent No.: US 7,009,114 B2
(45) Date of Patent: Mar. 7, 2006

(54) WIRING SUBSTRATE, METHOD OF PRODUCING THE SAME, AND ELECTRONIC DEVICE USING THE SAME

(75) Inventors: Jun Urakawa, Omibachiman (JP); Mitsuyoshi Nishide, Shiga-ken (JP); Isao Kato, Shiga-ken (JP); Norio Yoshida, Ostu (JP); Tomonori Ito, Shiga-ken (JP)

(73) Assignee: Murata Manufacturing Co., LTD, Kyoto (JP)

( * ) Notice: Subject to any disclaimer, the term of this patent is extended or adjusted under 35 U.S.C. 154(b) by 1035 days.

(21) Appl. No.: 09/789,454

(22) Filed: Feb. 21, 2001

(65) Prior Publication Data

US 2003/0011999 A1 Jan. 16, 2003

(30) Foreign Application Priority Data

Mar. 2, 2000 (JP) ........................... 2000-057475
Nov. 21, 2000 (JP) ........................... 2000-354130

(51) Int. Cl.
*H05K 1/00* (2006.01)

(52) U.S. Cl. ................ 174/250; 174/255; 174/260; 29/846; 118/406

(58) Field of Classification Search ............... 174/260, 174/250, 255; 361/772–779, 783; 118/406, 118/720–721; 228/139; 29/846, 848
See application file for complete search history.

(56) References Cited

U.S. PATENT DOCUMENTS

| 4,336,551 | A | | 6/1982 | Fujita et al. | |
|---|---|---|---|---|---|
| 5,665,526 | A | * | 9/1997 | Markovich et al. | 430/325 |
| 6,007,867 | A | | 12/1999 | Walsh et al. | |
| 6,531,664 | B1 | * | 3/2003 | Otto et al. | 174/260 |
| 6,542,379 | B1 | * | 4/2003 | Lauffer et al. | 361/793 |
| 6,543,131 | B1 | * | 4/2003 | Beroz et al. | 29/854 |
| 6,700,204 | B1 | * | 3/2004 | Huang et al. | 257/774 |

FOREIGN PATENT DOCUMENTS

| DE | 199 45 914 C1 | 9/1999 |
|---|---|---|
| EP | 0 516 402 A1 | 5/1992 |
| EP | 0 543 411 A2 | 11/1992 |
| EP | 0 516 402 A1 | 12/1992 |
| EP | 0 843 365 B1 | 5/1998 |
| JP | 04-196191 | 7/1992 |
| JP | 06-061368 | 3/1994 |
| JP | 09-162688 | 6/1997 |
| JP | 10-107442 | 4/1998 |
| JP | 11-251723 | 9/1999 |
| WO | WO 90/12695 A1 | 11/1990 |

* cited by examiner

Primary Examiner—Phuong T. Vu
Assistant Examiner—Jeremy Norris
(74) Attorney, Agent, or Firm—Keating & Bennett, LLP

(57) ABSTRACT

A ceramic multi-layer wiring substrate includes a line-shaped insulation pattern arranged to extend over a plurality of surface wiring patterns and to intersect the respective surface wiring patterns, in which soldering land electrodes are defined by the insulation patterns.

19 Claims, 6 Drawing Sheets

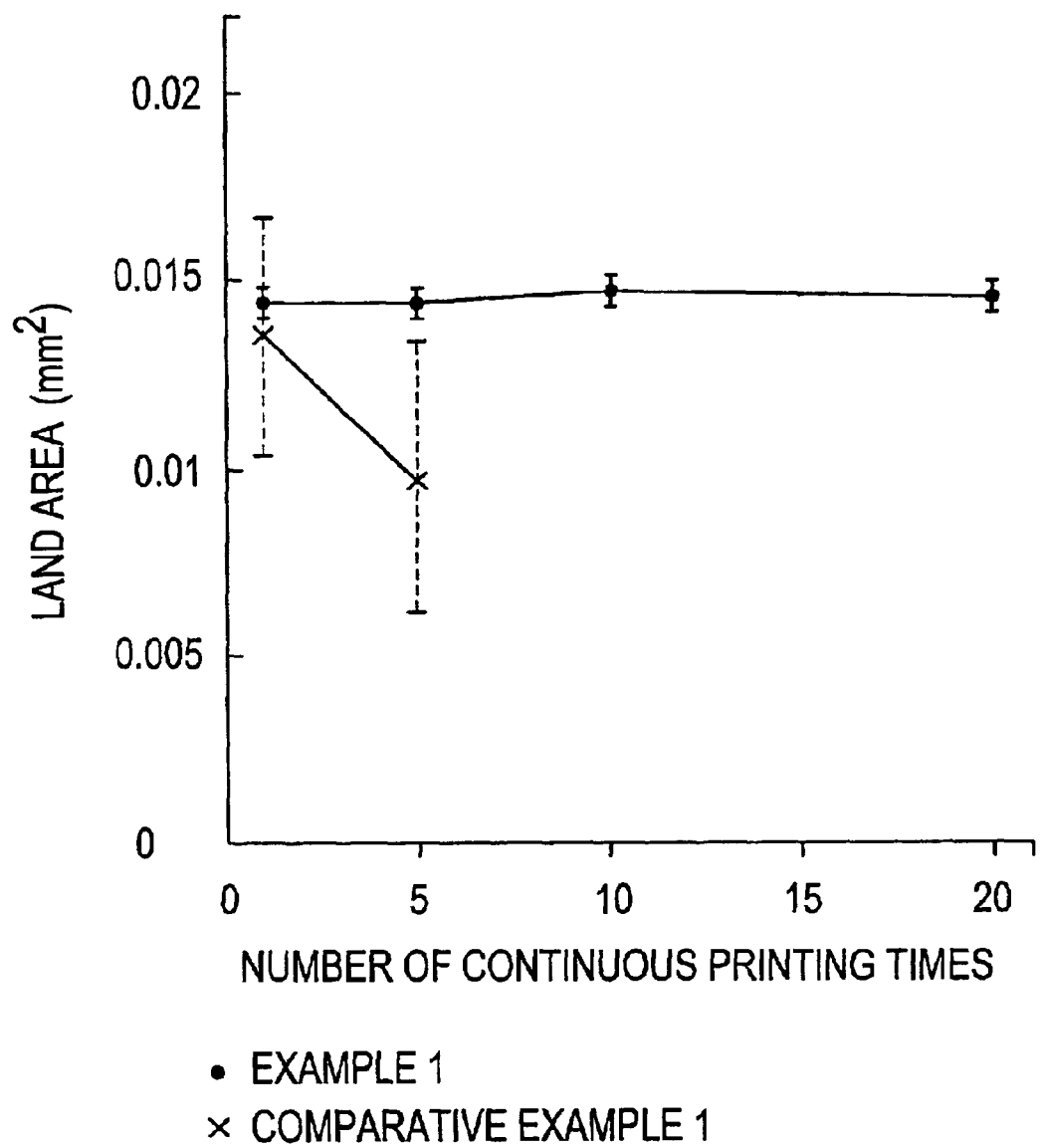

Ic
WIRING SUBSTRATE, METHOD OF PRODUCING THE SAME, AND ELECTRONIC DEVICE USING THE SAME

BACKGROUND OF THE INVENTION

1. Field of the Invention

The present invention relates to a wiring substrate such as a ceramic multi-layer wiring substrate or other such substrate, a method of producing the same, and an electronic device including such a substrate.

2. Description of the Related Art

Recently, for electronic devices such as mobile communications equipment, computers, and other such devices, the required performance has been greatly increased, and the sizes of the devices have been greatly reduced. These improvements have been realized by the enhanced performance of semiconductor devices such as LSI or other such devices and by the high density wiring of wiring substrates on which the semiconductors are mounted. Ceramic multi-layer wiring substrates, which enable three-dimensional wiring and have a high reliability, are useful as these wiring substrates.

Moreover, with the improvements in performance and reduction in size of different types of semiconductor devices, it has become even more of a requirement that the ceramic multi-layer wiring substrates achieve connection via multi-terminals and with a small pitch, while having high wiring density and so that high frequency signals can be processed. In addition, in order to cope with the multi-terminal and small pitch connection, many fine land electrodes are disposed on the main surface of each ceramic multi-layer wiring substrate.

Referring to a ceramic multi-layer wiring substrate having a land electrode defining a soldering land, a technique for preventing solder from being excessively wetted and spread and by flowing out from a desired area, is known, in which a solder resist having a low wettability for the solder is formed to define a solder resist layer in an area where adhesion of the solder is undesired.

Conventionally, the solder resist layer for defining the soldering land is formed on the entire surface or almost the entire surface, excluding the solder land, of the ceramic multi-layer wiring substrate. For example, Japanese Unexamined Patent Application Publication No. 10-107442 discloses a ceramic multi-layer wiring substrate in which an overcoat layer is formed on the whole surface of the substrate, excluding the areas (soldering lands) that are intended to function as connection pads (corresponding to land electrodes) and terminal electrodes. Moreover, Japanese Unexamined Patent Application Publication No. 11-251723 discloses a ceramic multi-layer wiring substrate in which an insulation layer is formed on almost the entire surface of the substrate, excluding the area near the lower surface of the mounting part, in addition to connection pads for mounting a mounting part such as a capacitor, an oscillator, or other suitable component or element.

In general, the overcoat layer and the insulation layer for defining the solder formation areas on the ceramic multi-layer wiring substrate, are formed by adding and mixing ceramic powder or glass powder with an organic vehicle, and screen-printing the resulting insulation paste.

Here, a screen plate used for screen printing includes a mesh of knitted thin wires, and an emulsion for defining a paste-passing area. When the insulation layer is formed over a wide area excluding fine areas, the area ratio of the emulsion is small. Accordingly, in such a case, the emulsion tends to bend on the screen plate. Thus, in some cases, the insulation paste intrudes on the under side of the emulsion, which blurs the coated insulation paste.

For the purpose of mounting high-quality, small-sized semiconductor devices via multi-terminals and with small pitches, as described above, it is necessary to form many fine soldering lands on the main surface of a ceramic multi-layer wiring substrate. When the insulation layer and the overcoat layer is formed substantially on the whole surface excluding the soldering lands during the screen printing, the soldering lands tend to be spoiled because of blurring of the insulation paste. Thus, it is difficult to form fine soldering lands with high accuracy.

SUMMARY OF THE INVENTION

In order to overcome the problems described above, preferred embodiments of the present invention provide a wiring substrate which copes with reduction in size and mounting at high density, a method of producing such a substrate, and an electronic device including such a substrate.

To solve the above-described problems with the prior art, according to preferred embodiments of the present invention, a wiring substrate includes a substrate having a wiring pattern, and a line-shaped insulation pattern disposed on the substrate so as to intersect the wiring pattern and to define a portion of the wiring pattern for a land electrode.

Preferably, another line-shaped insulation pattern arranged substantially parallel to the insulation pattern is disposed on the substrate.

Also preferably, a plurality of wiring patterns are provided on the substrate, and the insulation pattern is arranged to extend over the plurality of wiring patterns.

Moreover, preferably, a mounting part is mounted on at least one of the main surfaces of the substrate, and the mounting part is electrically connected to the land electrode.

Furthermore, preferably, the insulation pattern is a solder resist pattern that is arranged to define the land electrode for a solder formation area.

Also, preferably, the substrate is a multi-layer wiring substrate having internal wiring patterns constituting a plurality of layers.

Furthermore, preferably, the substrate is a ceramic substrate, and the insulation pattern contains ceramic as a major component.

According to other preferred embodiments of the present invention, a method of manufacturing a wiring substrate includes the steps of forming a wiring pattern on a substrate, and forming an insulation pattern on the substrate so as to intersect the wiring pattern and define a portion of the wiring pattern for a land electrode.

Preferably, another line-shaped pattern is formed substantially parallel to the insulation pattern on the substrate.

Furthermore, the method also preferably includes the steps of forming a plurality of the wiring patterns on the substrate, and forming the insulation pattern so as to extend over the plurality of wiring patterns.

Also, preferably, another line-shaped insulation pattern is formed substantially parallel to the insulation pattern on the substrate.

Moreover, preferably, the method according to other preferred embodiments, includes the steps of forming a plurality of wiring patterns on the substrate, and forming the insulation pattern so as to extend over the plurality of wiring patterns.

Furthermore, the method according to other preferred embodiments includes the step of mounting a mounting element on at least one of the main surfaces of the substrate so as to be electrically connected to the land electrode.

The insulation pattern may be formed as a solder resist pattern that defines the land electrode for a solder formation area.

Furthermore, as the substrate, a multi-layer wiring substrate having internal wiring patterns constituting a plurality of layers may be used.

Preferably, the method according to other preferred embodiments includes the steps of forming the wiring pattern on a ceramic substrate, and forming, as the insulation pattern, a pattern containing ceramic as a major component.

Preferably, the method according to various preferred embodiments of the present invention includes the steps of forming the wiring pattern on a ceramic green sheet, forming the insulation pattern on the ceramic green sheet, press-bonding the ceramic green sheet with other ceramic green sheets to form a press-bonding body, and firing the press-bonding body.

Furthermore, according to other preferred embodiments of the present invention, there is provided an electronic device provided with a wiring substrate in accordance with the other preferred embodiments of the present invention described above.

In the wiring substrate in accordance with various preferred embodiments of the present invention, since the line-shaped insulation pattern is arranged to intersect the wiring pattern on the substrate and define a portion of the wiring pattern for a land electrode, high precision fine land electrodes, especially, land electrodes that much more accurately formed are achieved due to the insulation pattern. For different kinds of wiring substrates, high density wiring and great reduction in size can be achieved.

The method of manufacturing a wiring substrate in accordance with preferred embodiments of the present invention includes the steps of forming a wiring pattern on a substrate, and forming an insulation pattern on the substrate so as to intersect the wiring pattern and define a portion of the wiring pattern for a land electrode. Therefore, high-precision, fine areas (land electrodes), especially, land electrodes that are much more accurately formed are achieved. Thus, wiring substrates having a high density wiring and a greatly reduced size is manufactured with high reproducibility and excellent results.

Moreover, the electronic device in accordance with various preferred embodiments of the present invention is provided with a wiring substrate with a very high density wiring and a significantly reduced size. Accordingly, for electronic devices such as mobile communication devices, computers, and other such devices, highly significant reduction in size and great enhancement in performance can be achieved.

BRIEF DESCRIPTION OF THE DRAWINGS

FIG. 7 is a graph showing the relationship between the number of continuous printing times of a solder resist pattern and a land electrode area.

DETAILED DESCRIPTION OF PREFERRED EMBODIMENTS

Hereinafter, the present invention will be described in reference to preferred embodiments.

Figure 1:
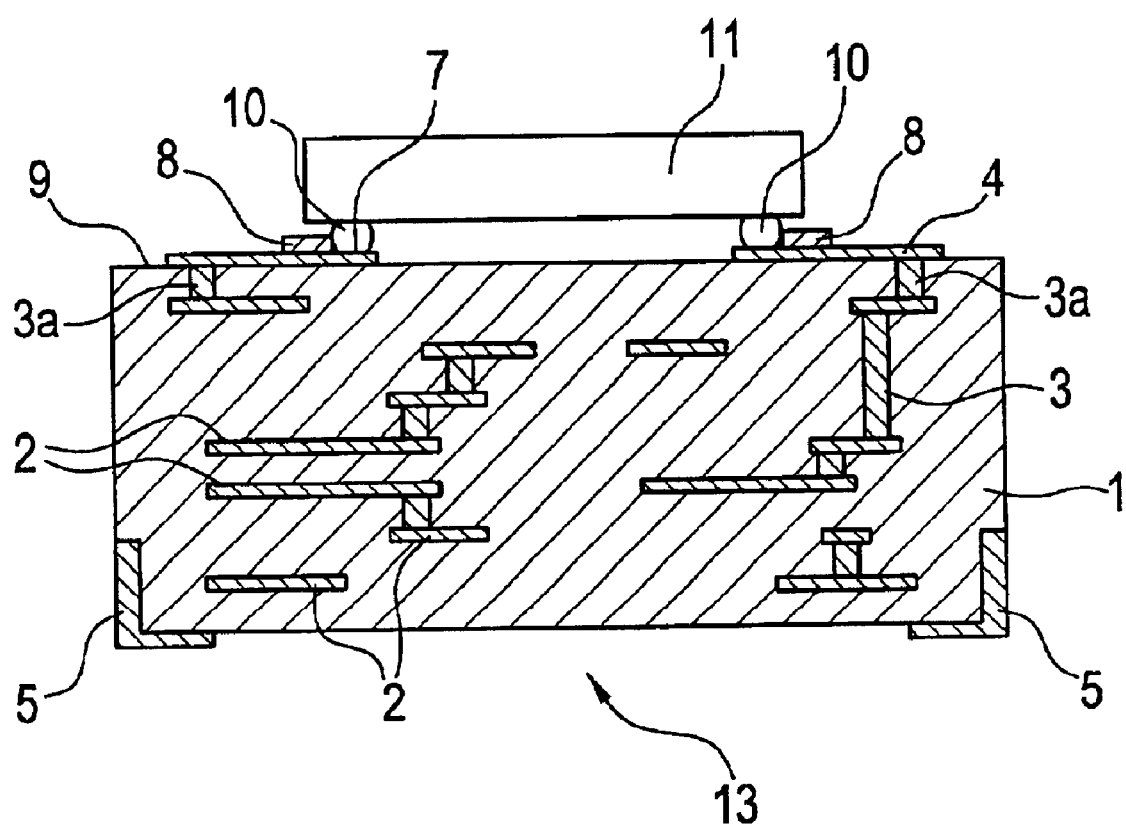
FIG. 1 is a schematic cross-sectional view of a ceramic multi-layer wiring substrate according to a first preferred embodiment of the present invention.

A wiring substrate according to the present preferred embodiment is a ceramic multi-layer module 13 preferably including a ceramic multi-layer wiring substrate 1 defining a substrate, and a semiconductor device 11 mounted on one main surface 9 of the ceramic multi-layer wiring substrate 1 via a solder 10, as shown in FIG. 1.

The ceramic multi-layer wiring substrate 1 includes internal wiring patterns 2 arranged to define a capacitor and wirings, inside thereof. Surface wiring patterns 4 are provided on the one main surface 9. Moreover, on the other main surface of the ceramic multi-layer wiring substrate 1, external terminals 5 each is arranged to extend partially onto the side surfaces of the wiring substrate 1. The ceramic multi-layer module 13 is connected to a motherboard or the like (not shown) via the external terminals 5. Furthermore, via-holes 3 and 3a are formed inside of the ceramic multi-layer wiring substrate 1. The internal wiring patterns 2 are connected to each other, and moreover, the internal wiring patterns 2 and the external terminals 5 are connected to each other through the via-holes 3, respectively. The internal wiring patterns 2 and the surface wiring patterns 4 are connected to each other through the via-holes 3a, respectively.

On the one main surface 9 of the ceramic multi-layer wiring substrate 1, line-shaped insulation patterns 8 are arranged to intersect the surface wiring patterns 4, respectively. The insulation patterns 8 have a low solder-wetting property, and act as solder resists. Accordingly, portions of the surface wiring patterns 4 define solder-formation areas, and the areas function as soldering land electrodes 7. That is, the semiconductor device 11, which is a mounting element, is electrically connected to the soldering land electrodes 7 provided on the one main surface 9, via the solders 10.

The ceramic multi-layer module 13 can be manufacturing according to various preferred embodiments described below.

First, referring to material for forming the ceramic multi-layer wiring substrate 1, an organic vehicle or aqueous vehicle is added in an adequate amount to ceramic powder which is capable of being fired at a low temperature, and mixed to prepare slurry for forming a ceramic green sheet.

The slurry for forming a ceramic green sheet is coated onto a carrier film via a doctor blade method or other suitable method to be formed in a sheet shape, which is dried to form a ceramic green sheet.

The ceramic powder capable of being fired at a low temperature can be fired at a temperature which is lower than the melting point (especially, lower than 1000° C.) of metallic powder of Ag, Cu, Au, Ni, Ag/Pd, Ag/Pt, or other suitable material. Powder of a glass composite type that is produced, e.g., by adding a glass component as a sintering assisting agent to ceramic powder such as alumina or other suitable material, ceramic powder of a crystallized glass type which deposits cordierlite, anorthite, or other suitable material, or ceramic powder of a non-glass type containing as a component barium oxide, silicon oxide, alumina, boron oxide, or other suitable material may be used.

The organic vehicle preferably includes polyvinyl alcohol, ethyl cellulose, acrylic resin, polyvinyl butyral, methacrylate resin, or other suitable material as a binder, and toluene, terpineol, buthyl carbitol acetate, alcohol, or other suitable material as a solvent. Various kinds of dispersants, plasticizers, activating agents, or other such elements may be added, if necessary.

Succeedingly, holes for the via-holes are formed in the ceramic green sheet by punching or other suitable method, if necessary. Thereafter, a conductive paste, produced by adding and mixing an organic vehicle with metallic powder of Ag, Cu, Au, Ni, Ag/Pd, Ag, Pt, or other suitable material, is filled in the holes for the via-holes to form the via-holes 3 and 3a. Moreover, a conductive paste of the same type as described above is screen-printed on a predetermined ceramic green sheet to form conductive patterns for constituting the internal wiring patterns 2 and the surface wiring patterns 4.

Thereafter, the insulation patterns 8 are formed on the ceramic green sheet on the one main surface 9 side (the ceramic green sheet for the outermost layer). Here, the insulation patterns each are preferably formed to have a line shape so as to extend over the plurality of surface wiring patterns 4 and so as to intersect the patterns 4. The insulation patterns 8 have an insulation property, and are formed by use of a thick film composition having a low solder wettability. The thick film composition is prepared, e.g., by adding and mixing an organic or aqueous vehicle in an adequate amount to different types of ceramic powders such as ceramic powder of a glass composite type, ceramic powder of a crystallization glass type, ceramic powder of a non-glass type, or other suitable materials.

Figure 2A:
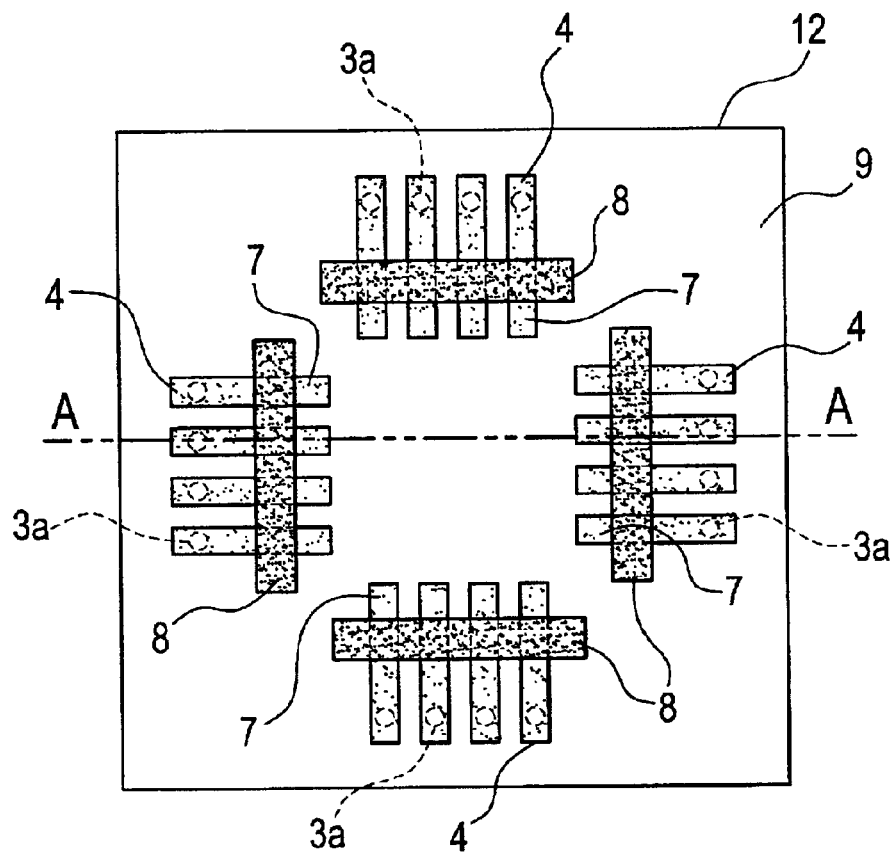
FIG. 2A a schematic plan view showing a process for manufacturing the ceramic multi-layer wiring substrate of the first preferred embodiment of the present invention.
Figure 2B:
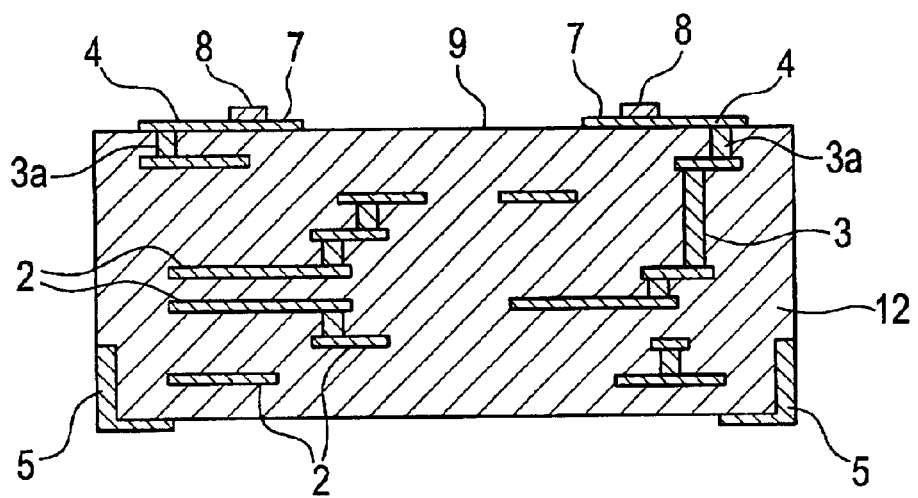
FIG. 2B is a cross-sectional view taken along line A—A in FIG. 2A.

A plurality of ceramic green sheets prepared according to the above-described procedures are sequentially laminated to form an unfired ceramic laminate 12 as shown in FIG. 2. That is, the unfired ceramic laminate 12 has, on one main surface 9 thereof, a plurality of surface wiring patterns 4 connected to the via-holes 3a, and the line-shaped insulation patterns 8 are formed so as to extend over the plurality of surface wiring patterns 4 and so as to intersect the patterns 4.

Thereafter, the entire unfired ceramic laminate 12 is hot-press bonded and fired in the air or in an oxidizing atmosphere or reducing atmosphere, at a temperature of about 1000° C. or lower, whereby the ceramic multi-layer wiring substrate 1 shown in FIG. 1 is formed. In this preferred embodiment, since the entire laminate 12 including the insulation patterns is press-bonded, the surface of the unfired ceramic laminate 12, obtained after the lamination, is flat, and moreover, the ceramic multi-layer wiring substrate, obtained after the firing, also has a flat surface.

After the surface wiring pattern 4 is plating-processed or coating-processed or similarly processed, if necessary, various semiconductor devices 11 are electrically connected to the soldering land electrodes 7 of the ceramic multi-layer wiring substrate 1 via the solders 10. Thereby, a ceramic multi-layer module 13, also as shown in FIG. 1, is completed.

That is, in this preferred embodiment, the line-shaped insulation patterns are preferably formed only on the locations that are needed for stopping of the undesired flowing of the solder. Accordingly, the printing area can be as small as possible. For this reason, though the solder is provided on the portion of the main surface that has different heights which is caused by the surface wiring patterns, blurring of the wiring patterns is prevented, and fine and accurate soldering land electrodes are achieved.

Especially, since the surface wiring patterns and the insulation patterns are formed before the hot-press bonding and firing, the insulation patterns suffer no surface dimensional variations, no deviation caused by firing-shrinking, and no other such defects. Thus, high precision, fine solder land electrodes can be formed via preferred embodiments of the present invention.

Moreover, with the line-shaped insulation patterns, the surface wiring patterns are prevented from being peeled from the substrate. Thus, the bonding strengths of the surface wiring patterns are greatly improved. In addition, differences between the firing behaviors, the thermal expansion coefficients, and other characteristics of the insulation layer materials and the substrate materials are greatly reduced. As a result, a ceramic multi-layer wiring substrate having minimal warp and distortion can be provided.

Figure 3:
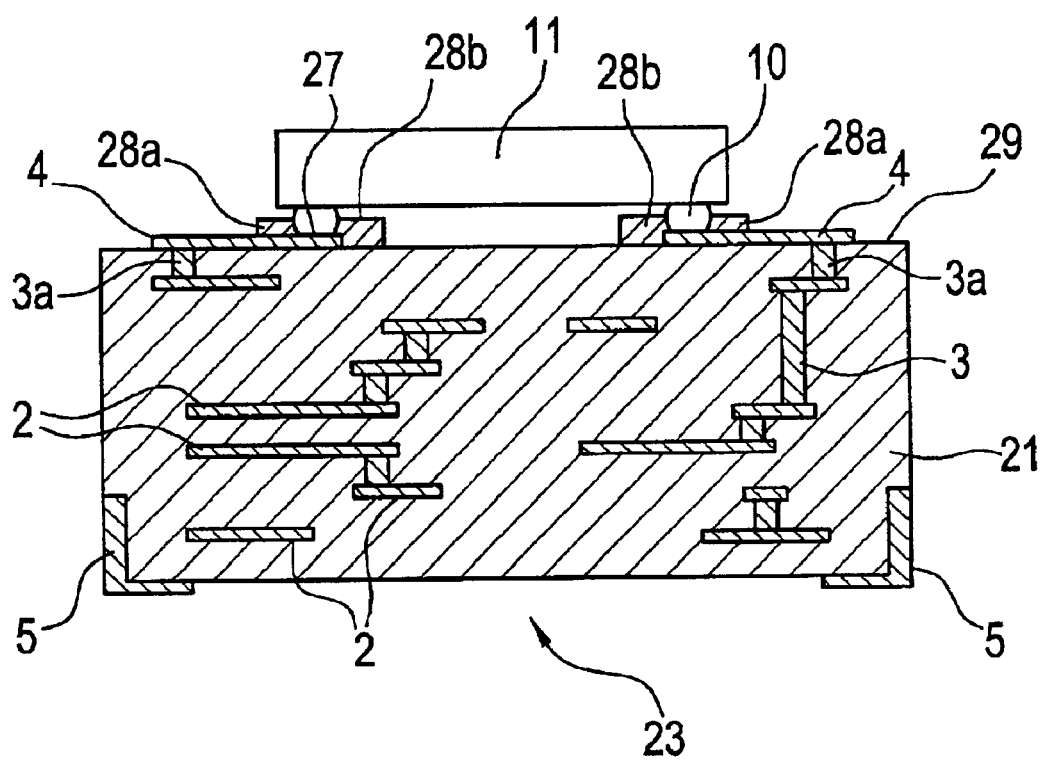
FIG. 3 is a schematic cross-sectional view of a ceramic multi-layer wiring substrate according to a second preferred embodiment of the present invention.

A wiring substrate of this preferred embodiment is a ceramic multi-layer wiring module 23 including a ceramic multi-layer wiring substrate 21 defining a substrate, and the semiconductor device 11 disposed on one main surface 29 of the ceramic multi-layer wiring substrate 21 via the solders 10, as shown in FIG. 3.

Here, the ceramic multi-layer wiring substrate 21 preferably contains the internal wiring patterns 2 inside thereof, similar to the first preferred embodiment. On the one main surface 29, the surface wiring patterns 4 of which first ends function as soldering land electrodes, respectively, are provided. On the other main surface thereof, the external terminals 5 are arranged so that a ceramic multi-layer wiring module 23 can be connected to a mother board or other substrate (not shown). Moreover, the via-holes 3 and 3a are formed inside of the ceramic multi-layer wiring substrate 21. With the via-holes 3, the internal wiring patterns 2 are connected to each other, and the internal wiring patterns 2 and the external terminals 5 are connected to each other, respectively. With the via-holes 3a, the internal wiring patterns 2 and the surface wiring patterns 4 are connected to each other, respectively.

Two substantially parallel line-shaped insulation patterns 28a and 29b are provided on the main surface 29 of the ceramic multi-layer wiring substrate 21 so as to intersect the surface wiring patterns 4. These insulation patterns 28a and 28b function as a solder resist, respectively. That is, the two substantially parallel insulation patterns 28a and 28b define a portion of the surface wiring patterns 4 for solder formation areas (solder land electrodes 27). The semiconductor device 11, which is a mounting element, is electrically connected to the solder land electrodes 27 via the solders 10.

The ceramic multi-layer wiring module 23 can be manufacturing according to the following preferred embodiments of the present invention.

First, as a material for forming the ceramic multi-layer wiring substrate 21, a ceramic green sheet is preferably formed similarly to the above-described first preferred embodiment. Succeedingly, holes for defining via-holes are formed in the ceramic green sheet by punching or other suitable process, if necessary. Conductive paste is filled into the via-holes, respectively, to form the via-holes 3 and 3a. Then, conductive paste is screen-printed onto a predetermined ceramic green sheet to form conductive patterns that define the internal wiring patterns 2 and the surface wiring patterns 4.

The insulation patterns 28a and 28b, which define a part of the surface wiring patterns 4 for the soldering land electrodes 27, a formed on a ceramic green sheet that defines the outermost layer on the main surface 29 side. Here, the insulation patterns 28a and 28b are formed by screen-printing a thick film composition or other suitable composition.

Figure 4A:
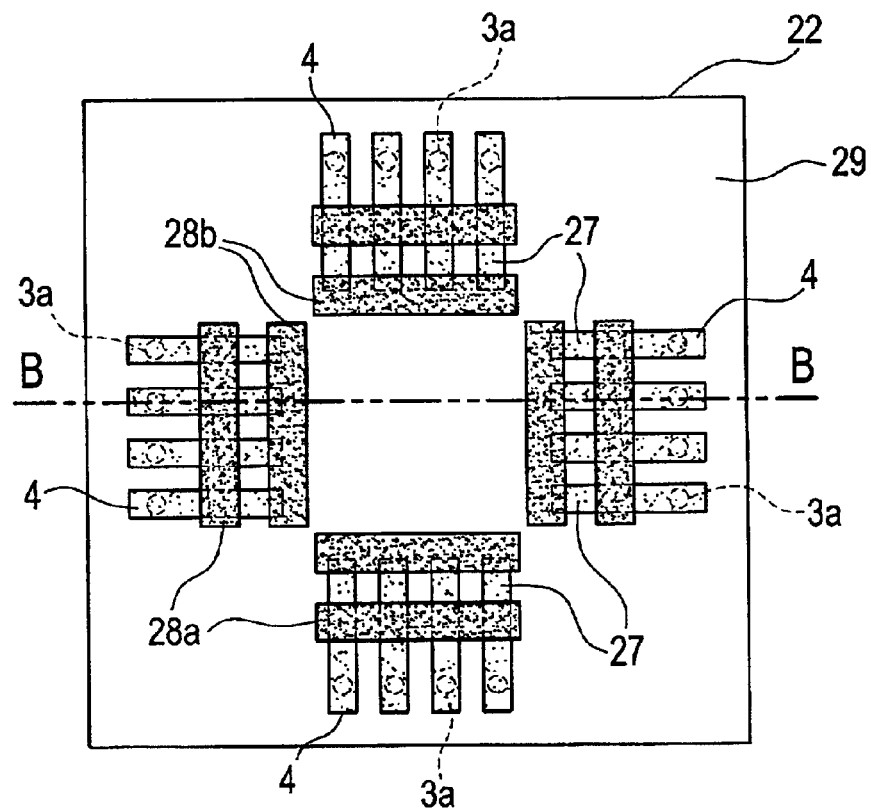
FIG. 4A is a schematic plan view showing a process for manufacturing the ceramic multi-layer wiring substrate of the second preferred embodiment of the present invention.
Figure 4B:
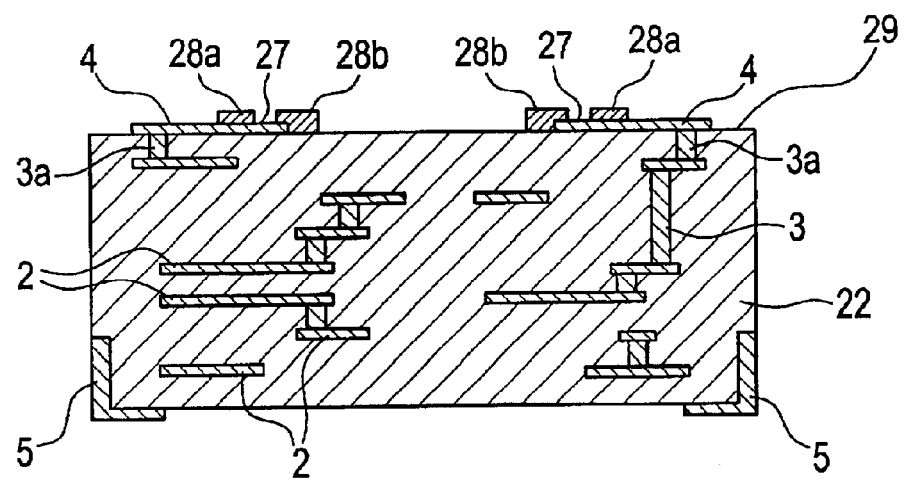
FIG. 4B is a cross-sectional view taken along line B—B in FIG. 4A.
Figure 5:
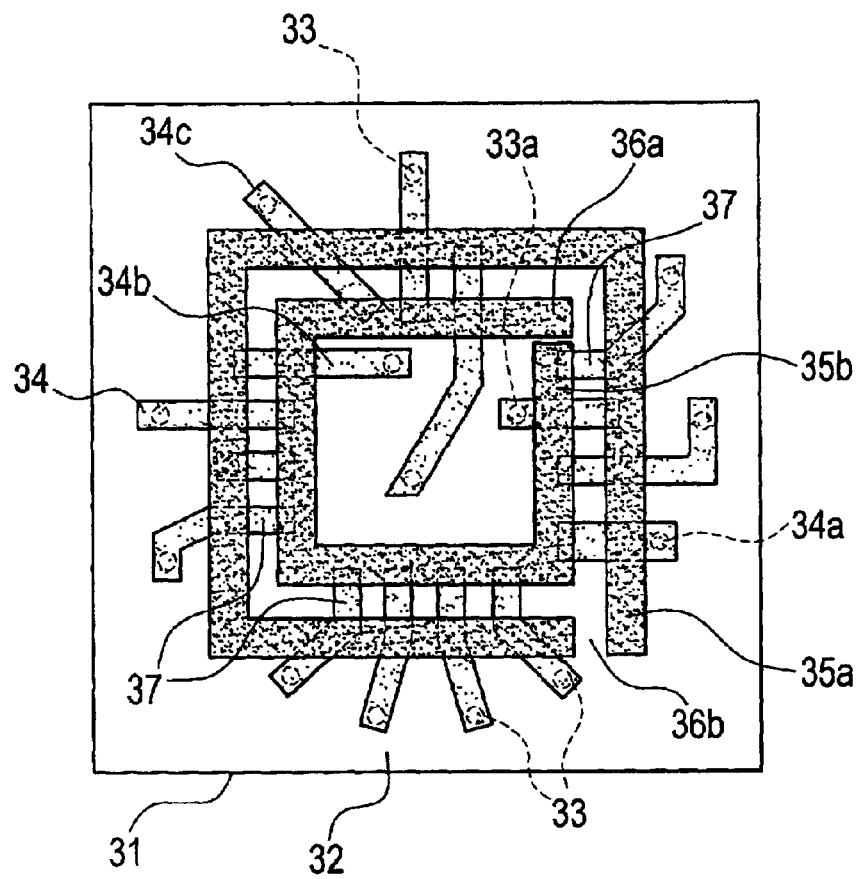
FIG. 5 is a schematic plan view of a ceramic multi-layer wiring substrate according to a third preferred embodiment of the present invention.

A plurality of ceramic green sheets prepared according to the above-described method are sequentially laminated to obtain an unfired ceramic laminate 22 as shown in FIG. 4. That is, the plurality of surface wiring patterns 4 connected to the via-holes 3a are provided on the one main surface 29 of the unfired ceramic laminate 22. The line-shaped insulation patterns 28a are arranged so as to extend over the plurality of surface wiring patterns 4 and intersect them. Moreover, the line-shaped insulation patterns 28b that are substantially parallel to the insulation patterns 28a are arranged so as to extend over the plurality of surface wiring patterns 4 and cover first one ends thereof, respectively. That is, as described above, these insulation patterns 28a and 28b define a portion of the surface wiring patterns 4 for solder formation areas, which function as the solder land electrodes 7, respectively.

Thereafter, the entire unfired ceramic laminate 22 is press-bonded and fired at a temperature of about 1000° C. or lower, in the air, in an oxidizing atmosphere, or in a reducing atmosphere, whereby the ceramic multi-layer wiring substrate 21 shown in FIG. 3 is formed. The semiconductor device 11 is electrically connected via the solders to the soldering land electrodes 7 provided on the one main surface 9 of the ceramic multi-layer wiring substrate 1, whereby the ceramic multi-layer wiring module 23 also shown in FIG. 3 is completed.

That is, in this preferred embodiment, since the soldering land electrodes each are defined by the two substantially parallel line-shaped insulation patterns, the areas of the soldering land electrodes are not substantially changed, even if the insulation pattern formation positions are deviated. For this reason, soldering land electrodes having a very fine area can be produced reliably with high production efficiency. Moreover, the soldering land electrodes are defined by the two substantially parallel line-shaped insulation patterns. Accordingly, even if the soldering land electrodes are deviated to some degree during printing, the deviation can be minimized.

A wiring substrate of the present preferred embodiment is a ceramic multi-layer wiring substrate 31 which contains surface wiring patterns 34 connected to via-holes 33, and insulation patterns 35a and 35b defining a portion of the surface wiring patterns 34 for soldering land electrodes 37.

Here, the two substantially parallel line insulation patterns 35a and 35b are formed to have a line shape so as to intersect the plurality of surface wiring patterns 34. Moreover, the two substantially parallel insulation patterns 35a and 35b are preferably formed to have a substantially rectangular shape.

Moreover, in the substantially rectangular insulation patterns 35a and 35b, disconnection portions 36a and 36b are provided as a part of the insulation patterns 35a and 35b, respectively, in order that emulsions on a screen plate can be connected with increased strength, and to eliminate blurring which is caused by distortion of the emulsions.

Moreover, on one main surface 32 of the ceramic multi-layer wiring substrate 31, via-holes 33 connected to internal wiring patterns formed inside of the substrate 31 (not shown) are also arranged in the area surrounded by the substantially rectangular insulation patterns 35a and 35, e.g., as seen in the via-holes 33a. Referring to the surface wiring patterns 34, a pattern having a wiring width different from that of the other surface wiring patterns as seen in a surface wiring pattern 34a, a pattern having a via-hole connection position different from the that of the respective other surface wiring patterns as seen in a surface wiring pattern 34b, and moreover, a pattern obliquely intersecting the insulation patterns 35a and 35b as seen in a surface wiring pattern 34c are formed, respectively.

That is, in this preferred embodiment, the design flexibility of the formation positions of the surface wiring patterns 34 is high. Accordingly, the via-holes 33 connected to the surface wiring patterns 34 can be drawn out from an optional position. Thus, a small-sized, high-quality ceramic multi-layer wiring substrate is provided. The non-connection portions are not needed in the insulation patterns 35a and 35b. The insulation patterns may be formed to have different shapes such as substantially circular, substantially spiral or substantially meander shape or other suitable shapes, in addition to the substantially rectangular shape.

Figure 6:
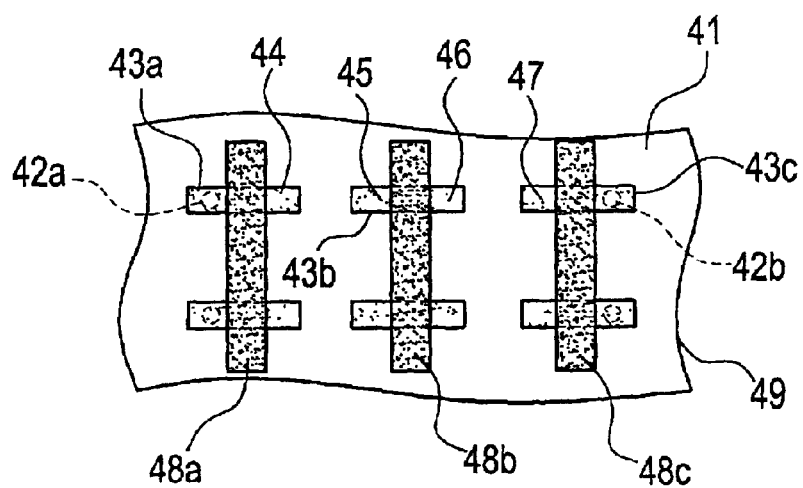
FIG. 6 is a partial schematic plan view of a ceramic multi-layer wiring substrate according to a fourth preferred embodiment of the present invention.

A wiring substrate of this preferred embodiment is a ceramic multi-layer wiring substrate 49 which preferred includes surface wiring patterns 43a connected to via-holes 42a, surface wiring patterns 43b not connected to a via-hole, surface wiring patterns 43c connected to via-holes 43b, and insulation patterns 48a, 48b, and 48c arranged so as to define a part of the respective surface wiring patterns for soldering land electrodes 44, 45, 46, and 47, as shown in FIG. 6.

Moreover, a portion of the surface wiring patterns 43a, defined by the insulation pattern 48a, function as the soldering land electrodes 44. A portion of the surface wiring patterns 43c, defined by the insulation patterns 48c, function as the soldering land electrodes 47. The surface wiring patterns 43b, defined by the insulation patterns 48b, function as the soldering land electrodes 45 and 46.

That is, in the ceramic multi-layer wiring substrate 49 having such a structure as described above, chip electronic components such as chip capacitors or other components can be electrically connected to each other via the surface wiring patterns 43b. Moreover, fine soldering land electrodes can be achieved. Thus, the ceramic multi-layer wiring substrate 49 can satisfactorily cope with miniaturization of these chip electronic components.

Various preferred embodiments of the present invention have been described above. In the first and second preferred embodiments, the line-shaped wiring patterns are preferably arranged to intersect the wiring patterns provided on the ceramic green sheet, the ceramic green sheet is press-bonded together with the other ceramic green sheets, and thereafter, is fired. Thereby, insulation patterns with minimal blurs and defects, having a high accuracy and a high strength are produced. Thus, wiring substrates with a very high density wiring, miniaturized size, and having a high reliability are produced.

The wiring substrate of the present invention is not limited to the ceramic multi-layer modules each having a semiconductor device mounted thereto and the ceramic multi-layer wiring substrates as described above.

In particular, the wiring substrate of the present invention may be a module device having a passive element such as a chip capacitor, a chip LC filter or other element mounted thereto, and may be applied as wiring substrates for multi-chip modules, hybrid IC's, or other devices. The substrate is not limited to a ceramic substrate, and may be a resin substrate such as a printed wiring substrate, a flexible substrate, or other suitable substrate.

Whether the ceramic wiring substrate is a single layer ceramic wiring substrate or a ceramic multi-layer wiring substrate, however, especially, in the case of the ceramic multi-layer wiring substrate, a cavity may be formed in one or both of the main surfaces. Furthermore, a passive element such as a capacitor, an inductor, and a combination thereof may be provided in the substrate. The production of the ceramic multi-layer wiring substrate is not limited to the green sheet lamination method. The ceramic multi-layer wiring substrate may be produced in a thick film printing method or other suitable method.

Moreover, the electronic device of various preferred embodiments of the present invention may be a mobile communications device, a computer, or other such device, provided with the ceramic multi-layer substrate or the ceramic multi-layer module according to preferred embodiments described above. For example, the ceramic multi-layer module 13 and the ceramic multi-layer wiring module 23 can be included in the input-output signal processing section or other suitable section of a mobile communications device.

In the above-described preferred embodiments, a thick film composition for forming the insulation patterns is preferably formed on each of the ceramic green sheets prior to the press-bonding step. The formation of the thick film composition may be carried out after the press-bonding step. In this case, the ceramic laminate, obtained after the lamination, has a high degree of flatness. Accordingly, the printing property for the thick film composition is greatly improved. However, in some cases, concavities and convexities, caused by the thick film composition, remain on the laminate after the screen printing. If the concavities and convexities are unfavorable for mounting of parts and formation of bumps, it is desirable that the pressing process is performed after the thick film composition is screen-printed.

In the above-described preferred embodiments, the land electrodes constituted by a portion of the wiring patterns, which are defined by the line-shaped insulation patterns, are soldering land electrodes. Preferably, solder is used to electrically connect the land electrodes to a mounting element. The land electrodes may be soldering land electrodes and gold bump land electrodes, and the connection member may be solder, a gold bump, or other suitable element.

Moreover, the present invention is suitable as a wiring substrate for mounting a flip chip or the like requiring many fine land electrodes. When a land electrode and a mounting element such as a semiconductor device or other suitable device are electrically connected to each other, a connection member such as a bump, a ball grid array or other suitable element is provided on the wiring substrate side on the mounting element side.

In the present invention, the thickness and the width of the insulation patterns are not particularly limited. Desirably, the patterns have a width and thickness such that the solder does not exceed that of the patterns. Moreover, desirably, the insulation patterns have a low solder-wettability.

Next, the thick film composition for forming the insulation patterns (solder resist patterns) on the ceramic multi-layer wiring substrate will be described.

First, desirably, the thick film composition contains, as a major component, powder of the same composition type as the ceramic powder constituting the unfired ceramic body, and the center particle size of the ceramic powder is preferably smaller than that of the ceramic powder constituting the unfired ceramic body. Thereby, the ceramic powders can be simultaneously fired while the excellent electric properties and shape-stability of the unfired ceramic body can be sufficiently assured.

The above term "the same composition type" means that the composition of the ceramic powder of the thick film composition is the same as that of at least one kind of components contained in the ceramic powder constituting the unfired ceramic body. For example, when the ceramic powder constituting the unfired ceramic body is ceramic powder including a $BaO$—$Al_2O_3$—$SiO_2$ type material, the ceramic powder of the thick film composition contains at least one of $BaO$, $Al_2O_3$, and $SiO_2$.

Preferably, the center particle size of the ceramic powder of the thick film composition is at least about 10% smaller than that of the ceramic powder constituting the unfired ceramic body. When the center particle size of the ceramic powder in the thick film composition is in the above-described range, the thick film composition can be sufficiently tightened under the firing conditions of the unfired ceramic body, even if a glass component or other such material is not added to the composition. If the center particle size of the ceramic powder of the thick film composition exceeds the above range, the thick film composition is insufficiently sintered under the firing conditions of the unfired ceramic body in some cases. Furthermore, preferably, the center particle size of the ceramic powder of the thick film composition is at least about 30% smaller than that of the ceramic powder constituting the unfired ceramic body.

In addition, the center particle size of the ceramic powder constituting the unfired ceramic body is preferably in the range of about 0.5 μm to about 10 μm, and the particle size of the ceramic powder of the thick film composition is preferably in the range of about 0.45 μm to about 9 μm. Moreover, desirably, the center particle size of the ceramic powder constituting the unfired ceramic body is preferably in the range of about 1 μm to about 5 μm, and the particle size of the ceramic powder of the thick film composition is preferably in the range of about 0.7 μm to about 3 μm. When the center particle sizes of the ceramic powders are in the above-described ranges, respectively, sintering of the unfired ceramic body and the thick film composition can be sufficiently achieved even at a relatively low temperature. Moreover, the maximum crude particle size of the ceramic powder of the thick film composition can be reduced to about 10 μm. Furthermore, the thick film composition, when it is screen-printed or formed via another process, exhibits a very good screen-passing property, and produces a pattern having an excellent shaping property.

Moreover, it is desirable that the thick film composition contains substantially no glass component, since the glass component diffuses into the unfired ceramic body, exerting an influence over the sintering property, when the simultaneous firing is carried out. Accordingly, a ceramic sintered body having minimal warp and distortion, and excellent electrical properties is provided. Moreover, with no glass component being contained, no segregation occurs onto the surface of the conductor patterns. Thus, excellent soldering and plating properties are reliably achieved.

For the purpose of differentiating the colors of the thick film composition and the unfired ceramic body from each other (or differentiating the colors of the insulation pattern and the ceramic sintered body), desirably, the thick film composition contains organic or inorganic colorants. That is, if the colors can be differentiated, sensing, inspection, or other such processing can be easily carried out in a printing process of the thick film composition, a mounting process of various mounting parts, or other steps.

In order to differentiate the colors, for example, as an organic colorant, an organic pigment (e.g., copper phthalocyanine, an azo type, a quinacridone, or the like) in an amount of about 0.1% to about 1.5% by weight of the ceramic powder of the thick film composition may be added. The thick film composition may contain up to about 3% by weight of oxide powder of at least one kind of metal selected from the group consisting of chromium, cobalt, copper, nickel, iron, and titanium, or other suitable material.

Moreover, desirably, the thick film composition contains an inorganic filler in an amount of up to about 30% by weight based on the ceramic powder of the thick film composition. Preferably, as the inorganic filler, materials that are difficult to be sintered and having a relatively high melting point, such as oxide ceramic powders of alumina, zirconia, magnesia, titanium oxide or other suitable materials, and ceramic powders of non-oxide types such as nitrides, carbides, or the like, are preferably used. By adding such an inorganic filler to the thick film composition, variations in firing profile, and variations in firing behavior caused by unevenness in the center particle sizes of the ceramic powders can be eliminated. Thus, insulation patterns having stable qualities can be formed. Moreover, the coating film strength and the printability of the thick film composition, and moreover, the strength of the insulation patterns are greatly improved.

Furthermore, the ceramic powder constituting the unfired ceramic body is preferably an oxide ceramic powder containing as major components barium oxide, silicon oxide, aluminum oxide, and boron oxide. Also desirably, the thick film composition preferably contains oxide ceramic powders of barium oxide, silicon oxide, aluminum oxide, and boron oxide. The ceramic powder of the above-described type can be fired even in a reducing atmosphere, and can be simultaneously fired with a low melting point metal such as Cu which has a low specific resistance and is inexpensive.

In the case in which the ceramic powder constituting the unfired ceramic body is of the above-mentioned type, desirably, the ceramic powder of the thick film composition contains about 20% to about 50% by weight on a BaO conversion basis of barium oxide, about 40% to about 70% by weight on a $SiO_2$ conversion basis of silicon oxide, about 2% to about 10% by weight on an $Al_2O_3$ basis of aluminum oxide, and about 1% to about 3% by weight on a $B_2O_3$ conversion basis of boron oxide. The thick film composition contains the ceramic powder at the above-mentioned weight ratios can be fired in an reducing atmosphere at a temperature up to about 1000° C., and can form a crystallized substance such as celsian or the like. Thus, an insulation pattern having an excellent high frequency characteristic with a low $\epsilon$ and a high Q, a minimal stray capacitance, no flow at firing, and a very high film strength is produced.

Referring to the ceramic powder of the thick film composition, if the amount of barium oxide is less than about 20% by weight on a BaO conversion basis, the firing temperature tends to be higher than the above-mentioned temperature. On the other hand, if the amount exceeds about 50% by weight, the reliability of the moisture resistance or other characteristics of the insulation pattern is deteriorated in some cases.

Moreover, if the amount of silicon oxide is less than about 40% by weight on a $SiO_2$ conversion basis, the $\epsilon$ is increased, and may affect the electrical properties. On the other hand, if the amount exceeds about 70% by weight, the firing temperature may become higher than the above-mentioned temperature. Furthermore, if the amount of aluminum oxide is less than about 2% by weight on an $Al_2O_3$ basis, the strength of the insulation pattern may be reduced. On the other hand, if the amount exceeds about 10% by weight, the firing temperature tends to become higher than the above-mentioned temperature. Furthermore, if the amount of boron oxide is less than about 1% by weight on a $B_2O_3$ conversion basis, similarly, the firing temperature tends to become higher. On the other hand, if the amount exceeds about 3% by weight, the reliability of the moisture resistance or other suitable characteristics may be reduced.

Moreover, in this case, desirably, the thick film composition contains an alkali earth metal oxide such as CaO, SrO, MgO, or other suitable materials, in an amount of up to about 3% by weight based on that of the ceramic powder of the thick film composition. These alkali earth metal oxides are substituted for Ba in the above-mentioned barium oxide, so as to improve the reliability of moisture resistance and other characteristics. However, if the addition amount of an alkali earth metal oxide exceeds about 3% by weight, the firing temperature may increase, and the electrical characteristics such as the dielectric constant, the Q value or other characteristics may be deteriorated.

Hereinafter, specific examples of preferred embodiments of the present invention will be described.

First, ceramic powder of a $BaO$—$SiO_2$—$Al_2O_3$—$B_2O_3$ type was prepared. With the ceramic powder, an organic binder including polyvinyl butyral, a plasticizer including di-n-butylphthalate, and an organic solvent including toluene and isopropylalcohol were mixed in appropriate amounts to prepare slurry for a ceramic green sheet.

Next, the slurry for a ceramic green sheet was coated onto a carrier film to be formed into a sheet by a doctor blade method. Thereafter, the sheet was dried to obtain a ceramic green sheet having a thickness of approximately 100 $\mu$m.

Next, holes for via-holes were formed in the above ceramic green sheet by punching. Copper paste containing Cu as a major component was filled into the holes so as to form the via-holes. Moreover, the copper paste containing Cu as a major component was screen-printed to form predetermined internal wiring patterns, if necessary. Onto a ceramic green sheet constituting the outermost layer on the mounting element side, the same copper paste containing Cu as a major component was screen-printed to form predetermined surface wiring patterns (wiring width was approximately 0.12 mm).

On the other hand, an alumina filler was added to the ceramic powder of the $BaO$—$SiO_2$—$Al_2O_3$—$B_2O_3$ type. An organic binder and an organic solvent were added in appropriate amounts, agitated and kneaded via a mixing and grinding machine and a three-roll mill to prepare the thick film composition for forming a solder resist pattern.

Then, the thick film composition was screen-printed in a predetermined pattern on the ceramic green sheet for constituting the above outermost layer via a screen plate including a mesh made of a stainless steel wire and an emulsion, whereby solder resist patterns defining solder formation areas (soldering land electrodes) were formed. The solder resist patterns were two substantially parallel line insulation patterns (line width was about 0.24 mm, and line-interval was about 0.12 mm) extending over the plurality of surface wiring patterns and intersecting the surface wiring patterns.

Next, a total of ten ceramic green sheets prepared as described above were laminated, and were cut to an approximately two-inch square, whereby the unfired ceramic laminates were produced. Each of the produced unfired ceramic laminates had a structure shown in FIG. 4, and soldering land electrodes were formed so as to have a regular square with dimensions of approximately 0.12 mm×0.12 mm (=0.144 mm$^2$)

Then, the entire ceramic laminate was hot press bonded under the conditions of a temperature of about 80° C. and a pressure of about 200 kg/cm$^2$, and fired at a temperature of up to about 1000° C. in a reducing atmosphere, whereby a ceramic multi-layer wiring substrate having the structure shown in FIG. 3 (a semiconductor was not mounted) was produced (Example 1).

For comparison, a ceramic multi-layer wiring substrate was prepared in the same manner as in the above-described Example 1, except that the above-described thick film composition was screen-printed on the entire surface, excluding the soldering land electrodes, of the ceramic green sheet for constituting the outermost layer (Comparable Example 1).

As a result, as shown in FIG. 7, in the ceramic multi-layer wiring substrate of the comparable example 1, when the above-mentioned thick film composition was screen-printed, variations in area of the soldering land electrodes increased. In the case of continuous printing, with the number of printing times being increased, the area of the respective soldering land electrodes was greatly reduced. Especially, when ten times continuous printing was carried out, the soldering land electrodes were not shaped.

On the other hand, in the ceramic multi-layer wiring substrate of Example 1, when the above-described thick film composition was screen-printed, variations in area of the soldering land electrodes were reduced to be within approximately ±5%. The solder resist patterns could be printed highly accurately, and fine soldering land electrodes could be accurately formed. Moreover, even in the case of continuous printing carried out at least twenty times, substantially no changes in area of the soldering land electrodes occurred, and the variations were very small. Thus, the ceramic multi-layer wiring substrate was very suitable for mass production.

Moreover, in the ceramic multi-layer wiring substrate of Example 1, the electrode adhesion strength of the surface wiring patterns was greatly improved. In addition, the warps of the substrate are even more suppressed as compared with the ceramic multi-layer wiring substrate of Comparable Example 1.

In the wiring substrate in accordance with various preferred embodiments of the present invention, the line-shaped insulation patterns are arranged so as to intersect the wiring patterns on the substrate, high-precision fine land electrodes, especially, solder formation areas that are not blurred, can be formed, due to the insulation patterns. For different kinds of wiring substrates, high density wiring and reduction in size can be achieved.

The method of producing the wiring substrate in accordance with preferred embodiments of the present invention preferably includes the steps of forming wiring patterns on a substrate, and forming insulation patterns on the substrate so as to intersect the wiring patterns on the substrate. Therefore, high-precision, fine land electrodes, especially, land electrodes that are much less blurred can be formed. Thus, wiring substrates having a high density wiring and a greatly reduced size can be produced with high reproducibility.

Moreover, the electronic device in accordance with other preferred embodiments of the present invention is provided with the wiring substrate having the very high density wiring and greatly reduced size. Accordingly, for electronic devices such as mobile communication devices, computers, and so forth, very significant reduction in size and greatly improved performance are achieved.

While preferred embodiments of the present invention have been disclosed, various modes of carrying out the principles disclosed herein are contemplated as being within the scope of the following claims. Therefore, it is understood that the scope of the present invention is not to be limited except as otherwise set forth in the claims.

What is claimed is:

1. A wiring substrate comprising:
   a substrate;
   a plurality of wiring patterns disposed on the substrate; and
   a line-shaped insulation pattern disposed on the substrate so as to intersect the plurality of wiring patterns and so as to define a portion of each of the plurality of wiring patterns for defining land electrodes; wherein
   the line-shaped insulation pattern includes four line-shaped portions, each of the four line-shaped portions extends substantially perpendicular to an adjacent one of the four line-shaped portions such that the line-shaped insulation pattern has a substantially rectangular shape, and includes a disconnection portion at which ends of the line-shaped insulation pattern are spaced from one another.

2. A wiring substrate according to claim 1, wherein another line-shaped insulation pattern is arranged substantially parallel to said line-shaped insulation pattern on the substrate.

3. A wiring substrate according to claim 1, wherein a mounting element is mounted on at least one of the main surfaces of the substrate, and the mounting element is electrically connected to the land electrodes.

4. A wiring substrate according to claim 3, wherein the line-shaped insulation pattern is a solder resist pattern that is arranged to define the land electrodes for a solder formation area.

5. A wiring substrate according to claim 1, wherein the substrate is a multi-layer wiring substrate having internal wiring patterns including a plurality of layers.

6. A wiring substrate according to claim 1, wherein the substrate is a ceramic substrate, and the line-shaped insulation pattern contains ceramic as a major component.

7. An electronic device comprising a wiring substrate according to claim 1.

8. An electronic device according to claim 7, wherein another line-shaped insulation pattern is arranged substantially parallel to said line-shaped insulation pattern on the substrate.

9. An electronic device according to claim 7, wherein a mounting element is mounted on at least one of the main surfaces of the substrate, and the mounting element is electrically connected to the land electrodes.

10. An electronic device according to claim 9, wherein the line-shaped insulation pattern is a solder resist pattern that is arranged to define the land electrodes for a solder formation area.

11. An electronic device according to claim 7, wherein the substrate is a multi-layer wiring substrate having internal wiring patterns including a plurality of layers.

12. An electronic device according to claim 7, wherein the substrate is a ceramic substrate, and the line-shaped insulation pattern contains ceramic as a major component.

13. A method of producing a wiring substrate comprising the steps of:

providing a substrate;

forming a plurality of wiring patterns on the substrate; and forming a line-shaped insulation pattern on the substrate so as to intersect the plurality of wiring patterns and so as to define a portion of each of the plurality of wiring patterns for land electrodes; wherein the line-shaped insulation pattern is formed to include four line-shaped portions, each of the four line-shaped portions extends substantially perpendicular to an adjacent one of the four line-shaped portions such that the line-shaped insulation pattern has a substantially rectangular shape, and to include a disconnection portion at which ends of the line-shaped insulation pattern are spaced from one another.

14. A method according to claim 13, further comprising the step of forming another line-shaped insulation pattern substantially parallel to the line-shaped insulation pattern on the substrate.

15. A method according to claim 13, further comprising the step of mounting a mounting element on at least one of the main surfaces of the substrate so as to be electrically connected to the land electrodes.

16. A method according to claim 15, wherein the line-shaped insulation pattern is formed as a solder resist pattern which defines the land electrodes for a solder formation area.

17. A method according to claim 13, wherein the step of providing the substrate includes providing a multi-layer wiring substrate having internal wiring patterns including a plurality of layers.

18. A method according to claim 13, further comprising the steps of forming the wiring pattern on a ceramic substrate and forming, as the line-shaped insulation pattern, a pattern containing ceramic as a major component.

19. A method according to claim 18, further comprising the steps of forming the wiring pattern on a ceramic green sheet, forming the line-shaped insulation pattern on the ceramic green sheet, press-bonding the ceramic green sheet together with other ceramic green sheets, to form a press-bonding body, and firing the press-bonding body.

* * * * *